(12) United States Patent
Ruedinger

(10) Patent No.: US 6,523,155 B1
(45) Date of Patent: Feb. 18, 2003

(54) METHOD FOR PARTITIONING A NETLIST INTO MULTIPLE CLOCK DOMAINS

(76) Inventor: Jeffrey Joseph Ruedinger, 2502 Oakridge Dr. SW., Rochester, MN (US) 55902

( * ) Notice: Subject to any disclaimer, the term of this patent is extended or adjusted under 35 U.S.C. 154(b) by 0 days.

(21) Appl. No.: 09/193,733

(22) Filed: Nov. 17, 1998

(51) Int. Cl.[7] .......................... G06F 17/50; G06F 9/455
(52) U.S. Cl. .................... 716/7; 716/6; 703/23
(58) Field of Search ................. 716/1, 2, 4, 5, 716/6, 7, 10, 11, 18; 703/13, 19, 23

(56) References Cited

U.S. PATENT DOCUMENTS

| | | | | |
|---|---|---|---|---|
| 5,452,239 | A | | 9/1995 | Dai et al. .................. 364/578 |
| 5,649,167 | A | * | 7/1997 | Chen et al. ................. 703/23 |
| 5,649,176 | A | | 7/1997 | Selvidge et al. ............ 395/551 |
| 5,659,716 | A | | 8/1997 | Selvidge et al. ............ 395/500 |
| 5,978,571 | A | * | 11/1999 | Grundmann ................. 703/23 |
| 6,173,435 | B1 | * | 1/2001 | Dupenloup .................. 716/18 |
| 6,263,478 | B1 | * | 7/2001 | Hahn et al. .................. 716/10 |
| 6,305,001 | B1 | * | 10/2001 | Graef ........................... 716/12 |

OTHER PUBLICATIONS

DeVane, "Efficient Circuit Patitioning to Extend Cycle Simulation Beyond Synchronous Circuits," IEEE/ACM Int'l Conference on Computer–Aided Design, Nov. 9–13, 1997, pp. 154–161.*

Kubista, "Hardware Assisted Logic Verification: IEC Case Study", Masters Project, University of Minnesota, Dec. 1997, pp. 1–63.

Ruedinger et al., "Technique to Synchronize an Emulator or Simulation Accelerator to Multiple Asynchronous Target Systems", IBM Technical Disclosure Bulletin, vol. 39 No. 10 pp. 117–120, Oct. 1996.

* cited by examiner

Primary Examiner—Leigh M. Garbowski
(74) Attorney, Agent, or Firm—Orrick, Herrington & Sutcliffe LLP (57) ABSTRACT

A method partitions a netlist into multiple clock domains. The number of clock domains is the number of primary input clocks plus one freerun domain. First, each functional block in the netlist is colored with a number of colors corresponding to the number of primary input clocks. Buckets are then created, with one bucket corresponding to a particular clock domain. Each functional block in the netlist is then placed in one of the buckets according to one or more partition criterion, which takes into account the color of logic that feeds a functional block and the color of logic that the functional block feeds. The result is that the original netlist is partitioned into multiple netlists, each of which corresponds to a single clock domain. These multiple netlists may be executed in parallel to emulate the function of the circuit represented in the netlist.

18 Claims, 11 Drawing Sheets

Cycle Simulation

Prior Art    FIG. 1

Cycle 1

Cycle 2

Cycle 3

Cycle 4

Cycle 5

Cycle 6

Decision: Block 1 goes into Bucket A

FIG. 6

Decision: Block 1 goes into Bucket A or Bucket B, whichever minimizes I/O between buckets

FIG. 7

Decision: Block 1 goes into Bucket A

FIG. 8

Decision: Block 1 goes into Bucket A

Decision: Block 1 Copy 1 goes into Bucket A

FIG. 11

Decision: Block 1 Copy 2 goes into Bucket B

FIG. 12

Decision: PI goes into Bucket A

FIG. 13

Decision: Replicate PI

FIG. 14

Decision: PI2A goes into Bucket A
PI2B goes into Bucket B

FIG. 15

Decision: PI and PO go into Bucket FREERUN

FIG. 16

Decision: PO1 goes into Bucket A

FIG. 17

Decision: PO2 and Block 18 go into Bucket FREERUN

| Bucket A | Bucket B | FREERUN |
|---|---|---|
| PI1 | PI2B | AND4 |
| PI2A | R3 | PO5 |
| R1 | R8 | DPM1 |
| R2 | R9 | |
| R4 | R10 | |
| R5 | R11 | |
| R6 | AND3B | |
| R7 | INV2 | |
| AND1 | PO6 | |
| AND2 | PO7 | |
| AND3A | PO8 | |
| INV1 | PO9 | |
| INV3 | | |
| PO1 | | |
| PO2 | | |
| PO3 | | |
| PO4 | | |

FIG. 20

METHOD FOR PARTITIONING A NETLIST INTO MULTIPLE CLOCK DOMAINS

BACKGROUND OF THE INVENTION

1. Technical Field

This invention generally relates to systems modeling and development, and more specifically relates to hardware simulators and emulators.

2. Background Art

The proliferation of modem electronics into our everyday life is due in large part to the existence, functionality and relatively low cost of advanced integrated circuits. As technology moves ahead, the sophistication of integrated circuits increases. Today, our society is heavily dependant upon integrated circuits for everyday activity.

As technology continues to progress, new processing methods and circuit designs continue to drive the performance of integrated circuits and electronic systems higher. Integrated circuits and systems that existed only as designs a few short years ago have already entered production, been marketed, and are becoming obsolete today. In order to be competitive in this rapidly evolving environment, it is necessary for technology-based companies to quickly and efficiently design and test new integrated circuits and systems that take advantage of the latest technological advances.

When designing a new integrated circuit or electronic system, it is often necessary to determine how the new circuit or system will interact with and respond to other circuits or systems. Without a thorough understanding of the performance characteristics and operational parameters associated with a new integrated circuit or system, significant problems may surface once manufacturing and distribution begin. While a proposed integrated circuit or system could actually be manufactured in limited numbers for testing and evaluation purposes, it is usually more convenient, less time-consuming, less costly, and more efficient to create a model or functional prototype of the proposed system. This modeling is typically accomplished by using one or more of the following: 1) simulation systems that model hardware function and performance in software; 2) hardware-assisted software simulation systems; 3) hardware emulation systems that use a combination of software and hardware to model a circuit or system design. All three of these modeling techniques typically operate on a "netlist", which is a typical output format for many hardware description languages, such as Verilog and Very High Speed Integrated Circuit (VHSIC) Hardware Description Language (VHDL).

Simulation or emulation of an integrated circuit or electronic system becomes much more complicated when multiple independent clocks are present in the design. A system with multiple independent clocks is said to have multiple clock domains. A design that has multiple clock domains is difficult to model with a synchronous system. Known techniques for cycle simulation attempt to model multiple clock domains by using a base cycle that is a common factor of all of the clocks. However, these techniques are still synchronous in nature, and can mask design defects that may become apparent only when the hardware is manufactured.

More advanced techniques have been developed that allow a simulator or emulator to process events in parallel in a way that more closely approximates asynchronous behavior. These techniques essentially allow execution of events in different clock domains in parallel. In order to benefit from these techniques, it is necessary to partition a circuit design into different clock domains. The known methods for partitioning a circuit design into different clock domains require substantial effort by highly skilled circuit designers to manually partition the circuit into groups of components that correspond to different clock domains. For a complex integrated circuit, this effort is substantial and very time-consuming. Without a method for more efficiently partitioning a circuit into different clock domains, the electronics industry will continue to suffer from inefficient methods of partitioning netlists for circuits and systems that have multiple clock domains.

DISCLOSURE OF INVENTION

In accordance with the present invention, a method partitions a netlist into multiple clock domains. The number of clock domains is the number of primary input clocks plus one freerun domain. First, each functional block in the netlist is colored with a number of colors corresponding to the number of primary input clocks. Buckets are then created, with one bucket corresponding to a particular clock domain. Each functional block in the netlist is then placed in one of the buckets according to one or more partition criterion, which takes into account the color of logic that feeds a functional block and the color of logic that the functional block feeds. The result is that the original netlist is partitioned into multiple netlists, each of which corresponds to a single clock domain. These multiple netlists may be executed in parallel to emulate the function of the circuit represented in the netlist.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

OVERVIEW

Figure 1:
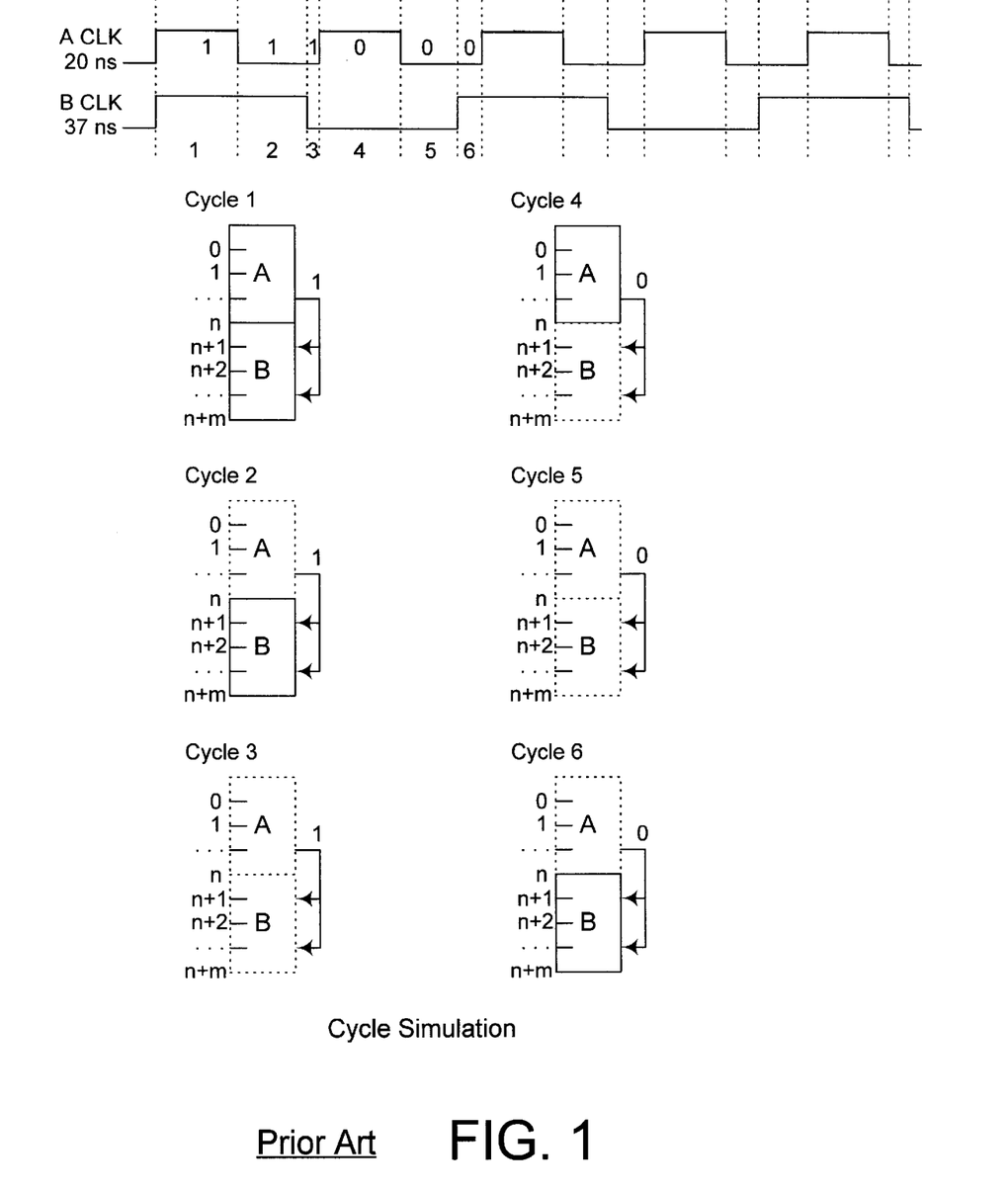
FIG. 1 is a block diagram and corresponding timing diagram of a prior art cycle simulation approach for simulating a sample system with two clock domains.

Simulation systems have been used for many years to model hardware systems or components in software. As described in the Background section, recent advances in simulator and emulator technology have resulted in systems that may be used to simulate or emulate circuits with multiple clock domains. FIG. 1 represents a cycle simulation system with two clock domains, an A clock with a 20 nanosecond (ns) period, and a B clock with a 37 ns period. The cycle simulation of FIG. 1 is a pure simulation system with a single processor, which means that netlists for the two clock domains must be evaluated sequentially. The cycle simulation system is assumed to have a cycle time that is relatively low, such as 100 cycles per second. We assume that the steps that simulate the circuits in the A clock domain are represented by a sequence of steps 0 through n in an evaluation list in each A block. Similarly, the steps that simulate the circuits in the B clock domain are represented by a sequence of steps n+1 through m in an evaluation list in each B block. For purposes of illustration, we assume the B evaluation list is executed after the A evaluation list, although in practice the evaluations would be interleaved. We assume that domain B references a signal from domain A twice, once early in B's evaluation list and once near the end, as indicated by the line leaving each block A and feeding twice into each block B in FIG. 1.

The timing diagram at the top of FIG. 1 illustrates the relationship between the A and B clocks. In order to evaluate these circuits in different clock domains, the cycle simulation approach must analyze each clock edge of either clock. The distance between clock edges is one cycle for the cycle simulation. The timing diagram of FIG. 1 has the first six cycles of the cycle simulation labeled under the B clock as cycles 1 through 6.

The operation of the simulator is analyzed for each of these six cycles, and is represented by the A and B blocks under the timing diagram for each of these six cycles. Note that the logic in both domains is always executed. However, if the clock is off, the corresponding logic is functionally disabled, which is represented by the dotted boxes in FIG. 1. Thus, for clock cycle 1, both A and B are enabled. For clock cycle 2, A is disabled and B is enabled. For clock cycle 3, both A and B are disabled. For clock cycle 4, A is enabled and B is disabled. For clock cycle 5, both A and B are disabled. And for clock cycle 6, A is disabled and B is enabled. These enable/disable states correspond to the state of the respective clocks in cycles 1 through 6 in the timing diagram. Note that with this cycle simulation approach, both references to the value of A in the B clock domain always read the same value, thereby providing a synchronous simulation of an asynchronous event that could mask problems in the design if the value of A were to change between the references to A in domain B.

The same two clock domain system of FIG. 1 can be analyzed using an improved emulator that provides enhanced performance. This "improved emulator" is not a prior art emulator, but is an emulator that uses an improved emulation technique that would provide improved performance compared to the prior art cycle simulation approach of FIG. 1. The improved emulator improves the emulation speed compared to the cycle simulation of FIG. 1 by providing hardware acceleration and parallel processors. Thus, the cycle time of the improved emulator might be in the range of 100,000 cycles per second rather than the 100 cycles per second for cycle simulation. In addition to the increase in cycle times, the improved emulator also improves performance by distributing gate evaluations across multiple "processors". For the purpose of illustration, we assume the A evaluation list is allocated to one processor and the B evaluation list is allocated to a second processor so that they can run in parallel. We also assume that the A evaluation list is of a different length than the B evaluation list. For the example of FIG. 1, we assume that evaluation list A is shorter than evaluation list B, which means that the processor executing the A list will be idle while waiting for the other processor to complete executing the B list. However, the increase in cycle speed due to hardware acceleration and the benefit of parallelism greatly enhances the performance of the improved emulator over the cycle simulation approach of FIG. 1.

Figure 2:
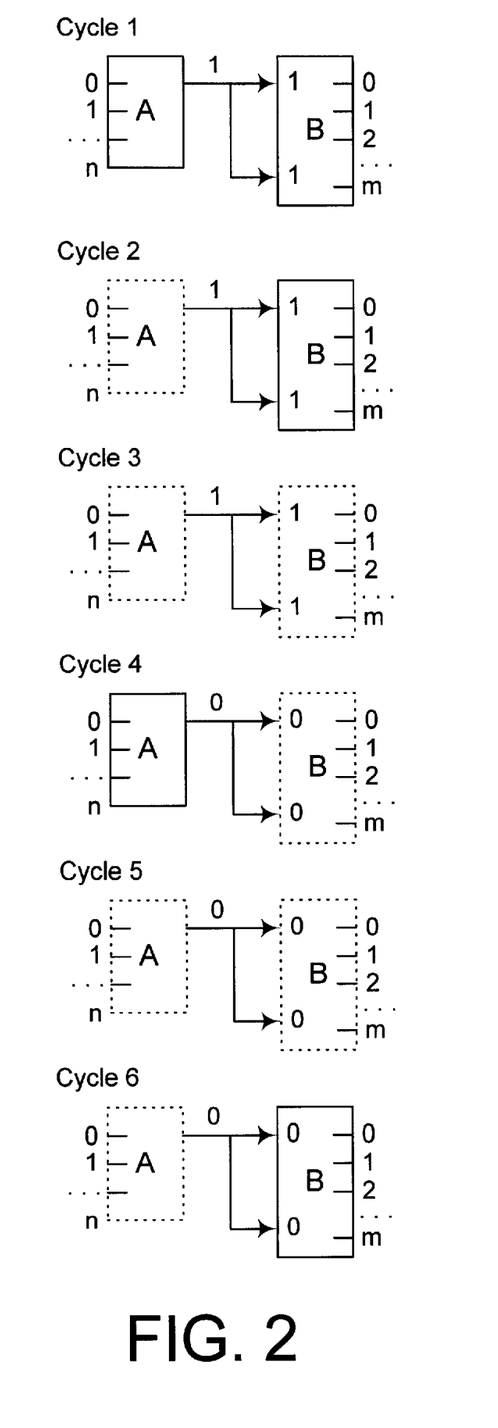
FIG. 2 is a block diagram of an improved emulator approach for emulating the sample system with two clock domains that is simulated in FIG. 1.

Referring to FIG. 2, the six cycles corresponding to the cycles in FIG. 1 for an improved emulator are shown. Notice that the A and B evaluation lists are executed in parallel by separate processors. However, like for cycle simulation, the value of A is always the same for both references to A in the B evaluation list. Thus, the improved emulator, while greatly increasing the speed of emulation, will still mask some design defects that might be discovered if asynchronous behavior could be more realistically simulated.

Figure 3:
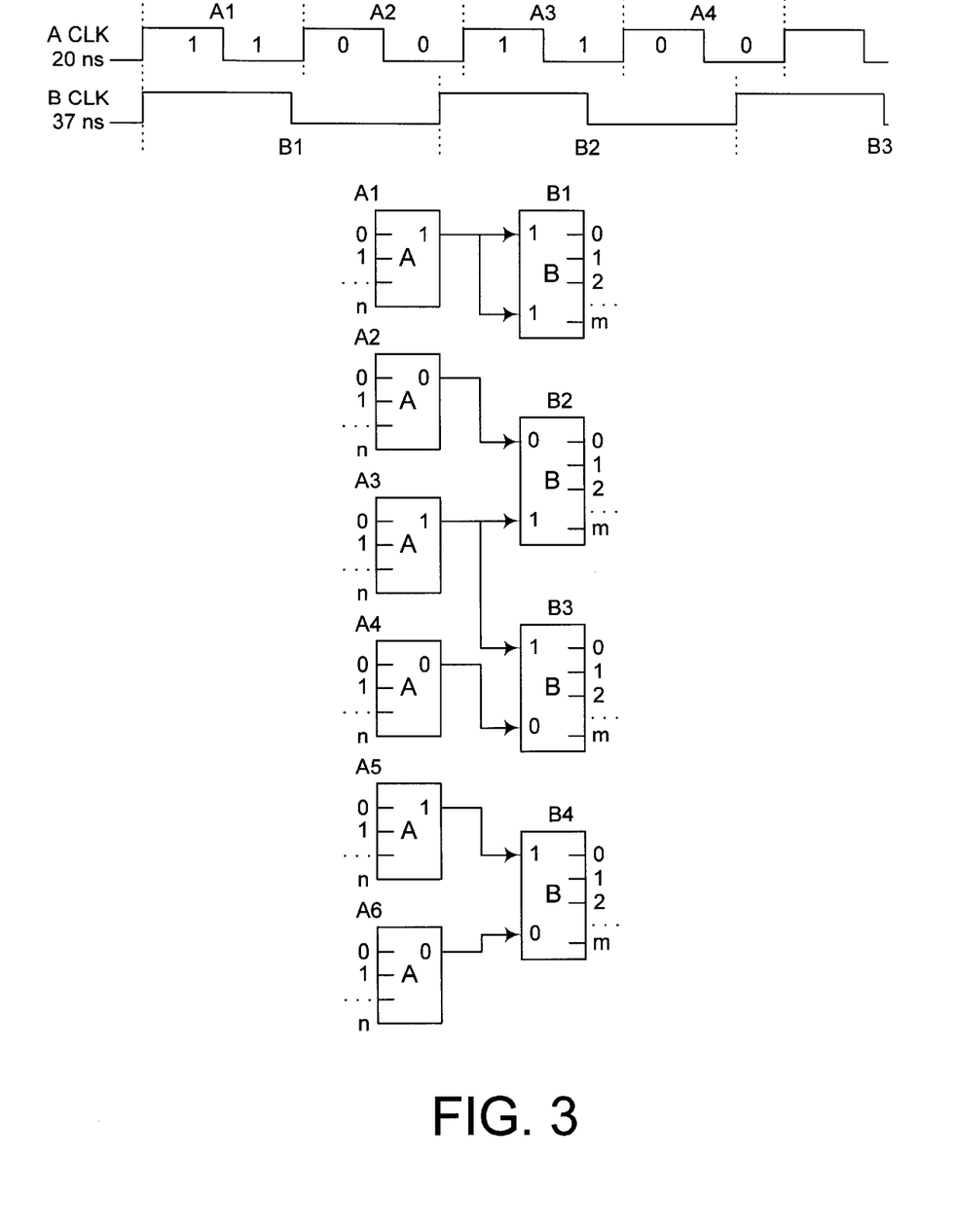
FIG. 3 is a block diagram and corresponding timing diagram of a an enhanced approach for emulating the sample system with two clock domains that is simulated in FIG. 1.

The performance of the improved emulator could be further increased if the processor executing the A list and the processor executing the B list were clocked by two independent clocks. This scenario is represented in FIG. 3. All of the A evaluation lists are executed by a first processor we call the A processor. All of the B evaluation lists are executed by a second processor we call the B processor. Because the A and B processors are clocked by separate clocks, the A processor has no idle time like in the improved emulator scenario shown in FIG. 2. Once the A processor executes the nth instruction in list A1, it commences the 0th instruction in list A2. This asynchronous clocking scheme allows the simulation of asynchronous events that would otherwise be masked by the prior art cycle simulator of FIG. 1 or the improved emulator of FIG. 2. As shown in FIG. 3, the value of A is the same for both references in block B1, but the value of A changes from the first reference in B2 to the second. An enhanced system with independent clocks more closely simulates asynchronous behavior. In addition, because the A and B processors are running independently of each other, there is no need to slice up the clocks with every clock transition, as in FIG. 1. Instead, the evaluation of list B equals one full clock cycle of the B clock. As shown in FIG. 1, the prior art cycle simulation approach and the improved emulation approach of FIG. 2 spend five cycles processing one B clock cycle, while the enhanced system of FIG. 3 uses only one cycle to process one B clock cycle. This results in a five-fold increase in performance (i.e., simulation/emulation speed) for the enhanced system of FIG. 3 over the improved emulator of FIG. 2.

DETAILED DESCRIPTION

To support clocking the A and B processors with independent clocks as described above with respect to FIG. 3, two different things are needed. First, the emulator run control hardware must allow multiple clocks to be controlled. Second, a method is needed to efficiently partition a netlist into separate parts so the different parts can be individually processed by the emulator. The present invention relates to this second aspect, a method for partitioning a netlist into different parts with each part representing a different clock domain in the netlist. The resulting parts for the different clock domains may be executed on an enhanced emulator as described in the Overview section with respect to FIG. 3. Each clock domain netlist will preferably be executed by a separate set of processors, thereby achieving maximum parallelism and hence, performance.

Figure 4:
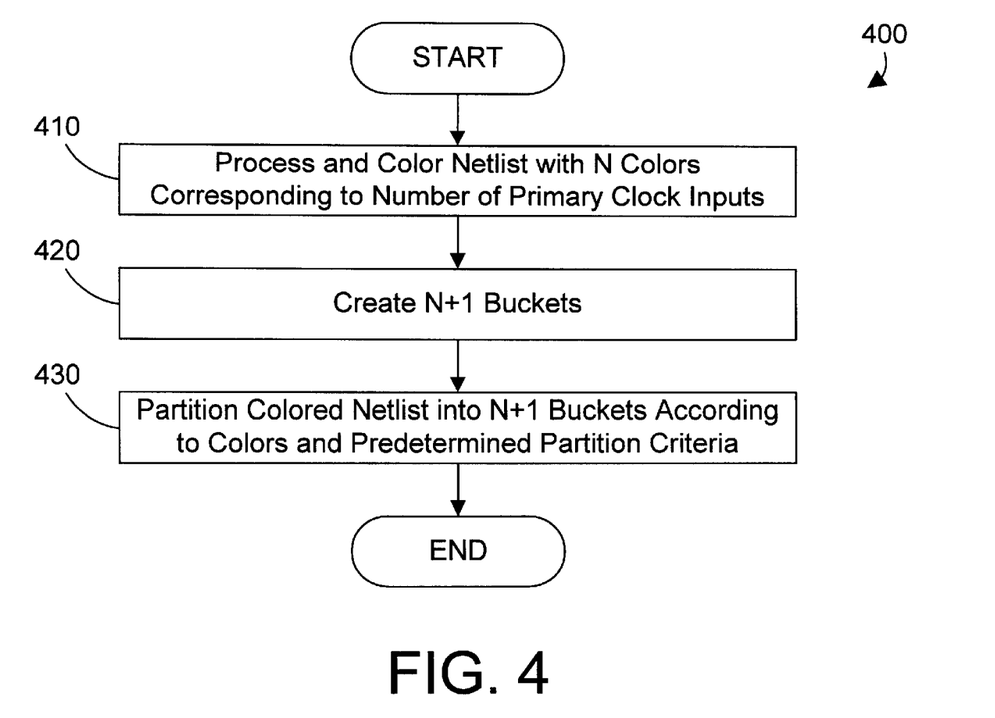
FIG. 4 is a flow diagram of a method for partitioning a netlist in accordance with a preferred embodiment.

Referring to FIG. 4, a method 400 in accordance with a preferred embodiment starts by processing and coloring the netlist with n colors corresponding to the number of primary input clocks (step 410). The concept of coloring is a well-known method of identifying items (such as circuit elements in the netlist) with certain attributes (such as clock domains). Once the netlist is colored, n+1 buckets are created (step 420). Finally, the colored netlist is partitioned (step 430) by placing each functional block in the netlist into one of the buckets created in step 420. The result is a number n+1 of netlists that are each separated into different clock domains. Each netlist can be separately compiled and may run on separate "domains" of processors within an emulator.

Figure 5:
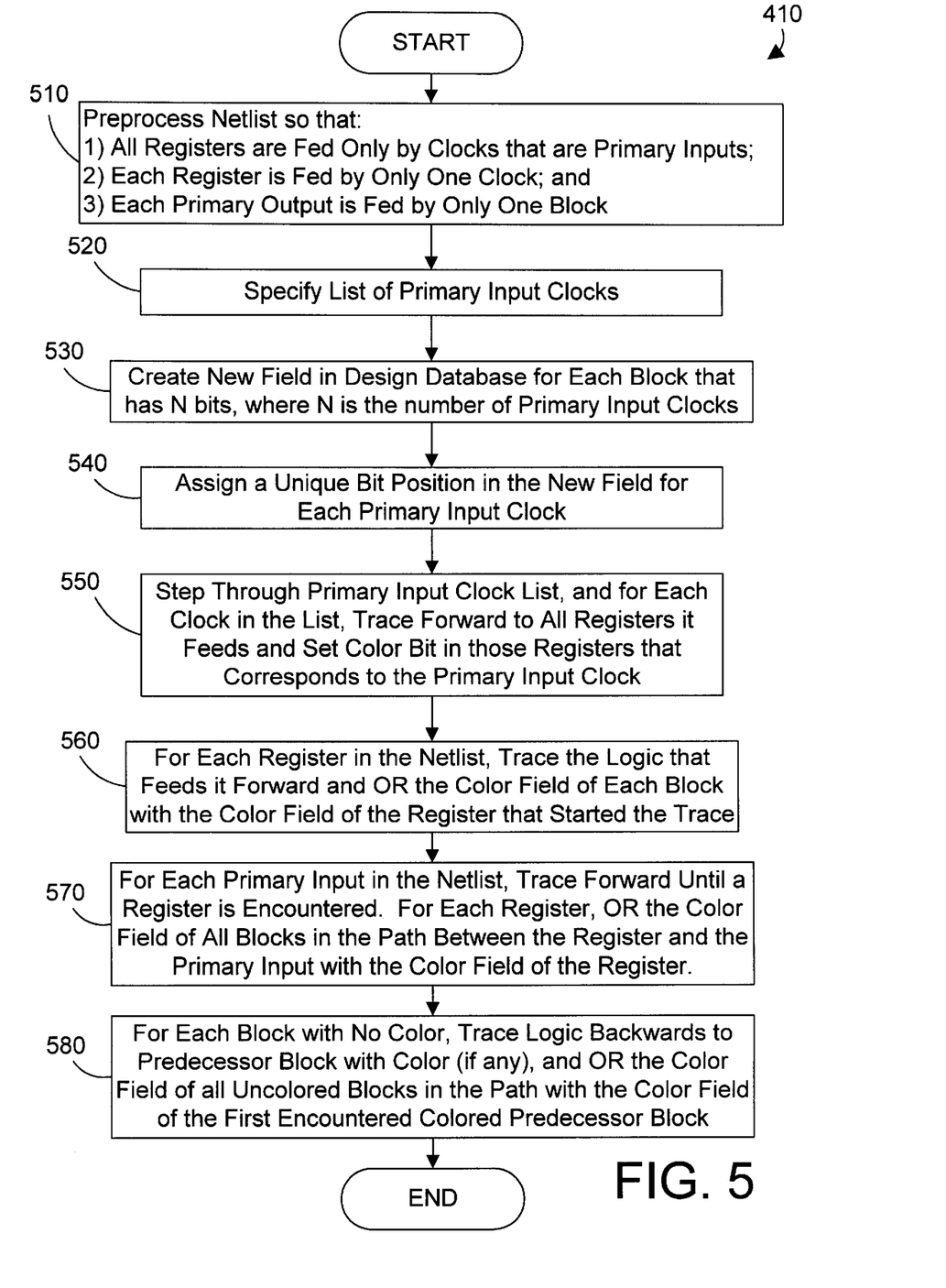
FIG. 5 is a flow diagram showing the steps performed in step 410 of FIG. 4.

FIG. 5 shows one specific embodiment of step 410 of FIG. 4. First, the netlist is preprocessed to assure that 1) all registers are fed only by clocks that are primary inputs; 2) each register is fed by only one clock; and 3) each primary output is fed by only one block (step 510). Note that step 510 may include the removal of gated clocks from a netlist. One known method for gated clock removal is disclosed in U.S. Pat. No. 5,452,239 "Method of Removing Gated Clocks From the Clock Nets of a Netlist for Timing Sensitive Implementation of the Netlist in a Hardware Emulation System", issued Sep. 19, 1995 to Dai et al. and assigned to Quickturn Design Systems, Inc. Next, the list of primary input clocks is specified (step 520). The primary input clocks are the independent clocks that each correspond to a different clock domain in the netlist. Next, a new field in the design database referred to herein as the "color field" is created for each block in the netlist that has a number "n" of bits equal to the number of primary input clocks (step 530). Each bit in the color field is then assigned a corresponding primary input clock (step 540). Next, the netlist is "colored" by setting one or more appropriate bits in the color field for each functional block in the netlist. First, the primary input clocks are analyzed. The color bit in all registers fed by a primary input clock are set to the color corresponding to the primary input clock (step 550). Once the primary input clocks have all been analyzed, attention is then turned to the registers in the netlist. For each register in the netlist, the color field of the logic that feeds the register output forward is logically ORed with the color field of the register (step 560). Finally, for each primary input in the netlist, the circuit is traced forward until a register is encountered. Then, for each register, the color field of the register is logically ORed with the color field of each block in a path between the register and the primary input (step 570). Finally, for each block with no color, the logic is traced backwards to see if a predecessor block has been colored. If a colored predecessor block is found that feeds the uncolored block, the uncolored block and all uncolored blocks in the path between the uncolored block and the predecessor block is colored with the color of the predecessor block by logically ORing the color field of all uncolored blocks in the path with the color field of the first encountered colored predecessor block (step 580). The result of step 410 is that all blocks in the netlist have been examined and either assigned a suitable color or left uncolored. Having no color is a valid situation and may happen if a primary input feeds a primary output with no colored register affecting the data path between the primary input and the primary output.

Once the netlist has been colored, it needs to be partitioned into the different clock domains. Referring back to FIG. 4, the next step after coloring (step 410) is to create n+1 buckets, where n is the number of primary input clocks (i.e., clock domains) in the netlist. The n buckets correspond to the colors that represent the primary input clocks, or different clock domains. The additional bucket is called a FREERUN bucket. These n+1 buckets are any suitable type of storage that can store one or more functional blocks from the netlist. The final step 430 is to partition the netlist into the n+1 buckets created in step 420 according to predetermined partition criteria (step 430). This step analyzes one functional block at a time, and places the functional block into one of the n+1 buckets. The predetermined partition criteria according to the preferred embodiments is described below with reference to FIGS. 6–18. Note that the discussion below refers to a block being "fed" by a clock domain to denote that the block has an input from a block or signal in that domain. The discussion below also refers to a block "feeding" a clock domain to denote that the block has an output to a block or signal in that domain.

Figure 6:
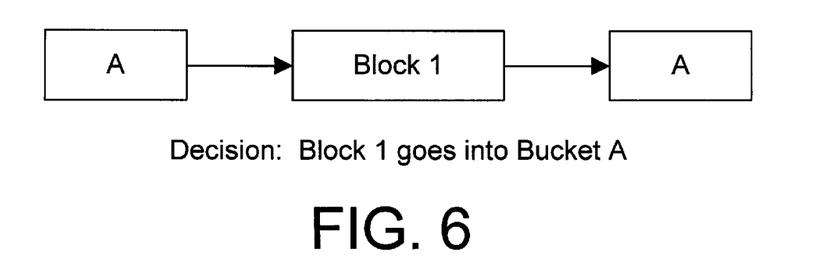
FIGS. 6–18 each show a block diagram of a type of circuit connection that may exist in a circuit that has two clock domains.
Figure 7:
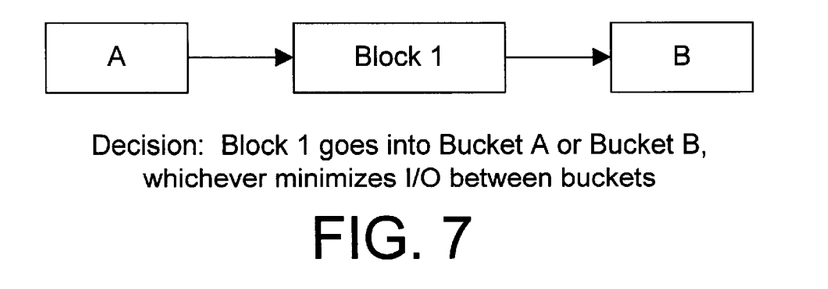
Figure 8:
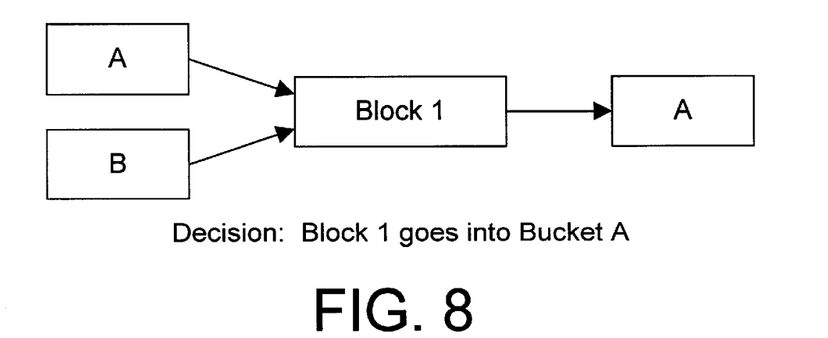
Figure 9:
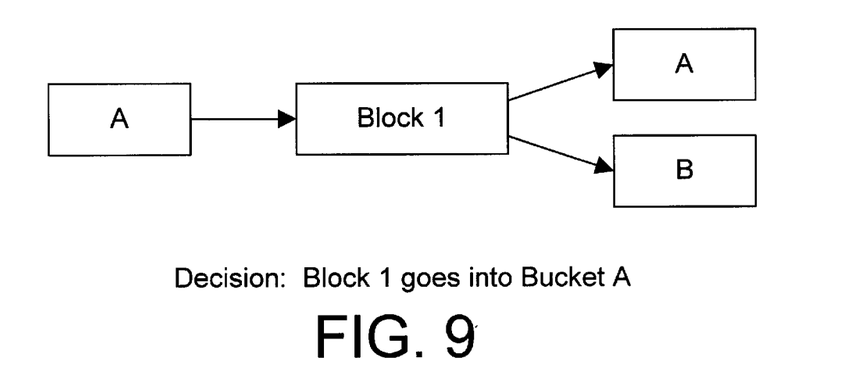
Figure 10:
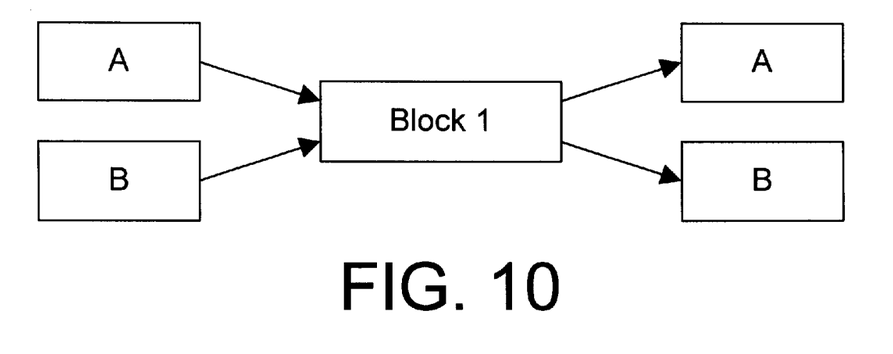
Figure 11:
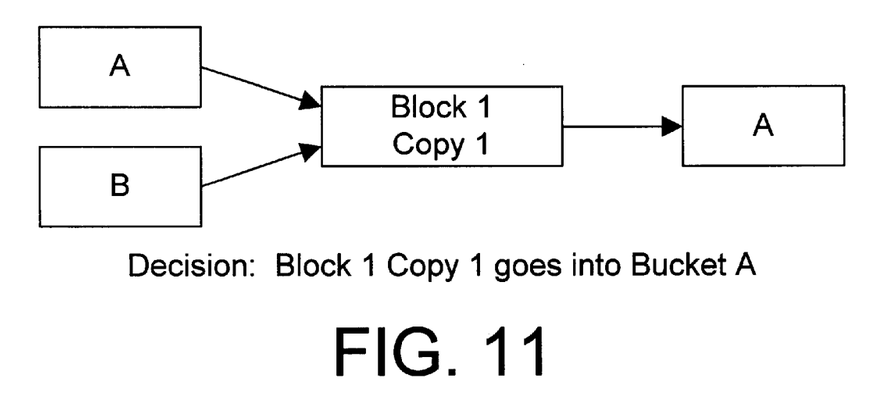
Figure 12:
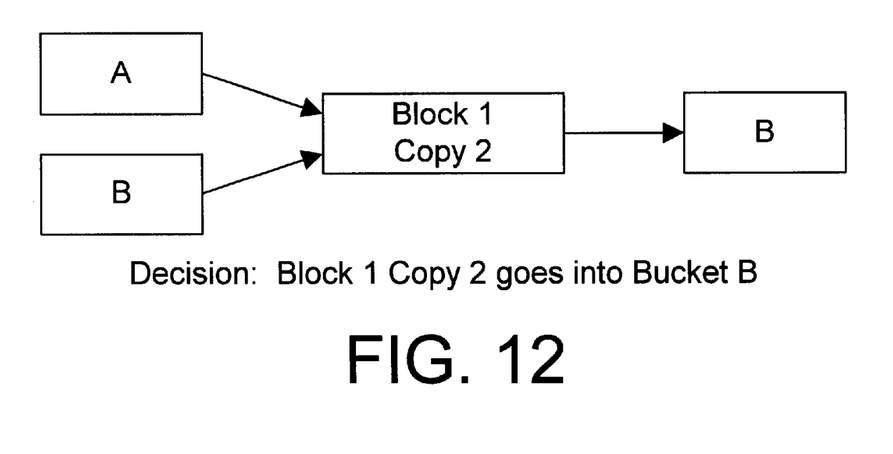

If a block is fed by only one clock domain, and feeds only the same clock domain, the block is placed in the bucket corresponding to the clock domain. Thus, as shown in FIG. 6, a block that is fed only by clock domain A and that feeds only clock domain A is placed into the A bucket. Referring to FIG. 7, if a block is fed by only one clock domain A, and feeds only a different clock domain B, the block is placed in either the A bucket or the B bucket, whichever minimizes input/output (I/O) signals between buckets. In other words, if block 1 of FIG. 7 has three inputs from clock domain A and one output to clock domain B, block 1 would be placed in the A bucket so that the three inputs from A are in the same bucket as block 1. If block 1 were placed in the B bucket instead, the three inputs to block 1, which are placed in bucket A, would all be I/Os to bucket B, which contains block 1. Thus, placing block 1 in bucket A results in minimizing I/O between buckets if there are more A inputs that B outputs. In similar fashion, if block 1 has only one input from domain A and has three outputs to domain B, block 1 is placed in bucket B to minimize I/O between buckets.

If a block is fed by different clock domains and feeds only one of those clock domains, the block is placed in the bucket corresponding to the common input and output clock domain. For example, in FIG. 8 block 1 has different inputs from domain A and domain B, but only feeds domain A. Block 1 is thus placed in the A bucket.

If a block is fed by only one clock domain and feeds the same clock domain and a different clock domain, the block is placed in the bucket corresponding to the common input and output clock domain. For example, in FIG. 9, block 1 is fed by domain A and feeds both domain A and domain B. Block 1 is placed in bucket A.

If a block is fed by multiple clock domains and feeds multiple clock domains, the methodology depends on whether the block is combinatorial or has memory elements. For example, referring to FIG. 10, block 1 is fed by both clock domains A and B, and feeds both clock domains A and B. Assuming that block 1 contains only combinatorial logic elements, block 1 is replicated (i.e., copied) to achieve the two circuit configurations in FIGS. 11 and 12. By replicating block 1, we break down the scenario in FIG. 10 to two different scenarios in FIGS. 11 and 12. Note that the scenarios in FIGS. 11 and 12 correspond to the configuration in FIG. 8, and according to the criteria discussed above with respect to FIG. 8, block 1 copy 1 (FIG. 11) goes into the A bucket, and block 1 copy 2 (FIG. 12) goes into the B bucket.

Referring again to FIG. 10, if block 1 contains any memory elements, block 1 is placed in the FREERUN bucket. The FREERUN bucket corresponds to a clock domain that is free-running, meaning that it is a separate clock domain that can always be accessed by any other clock domain during the emulation. The memory is not replicated to avoid introducing multiple copies of storage. Instead, the memory placed in the FREERUN domain and the interconnecting signals are treated as I/Os to and from the other domains. When each domain is processed by an emulator, the I/Os that access the FREERUN domain have time constraints placed upon them. Outputs to the FREERUN domain must be separated from inputs from the FREERUN domain by the amount of time it takes the FREERUN domain to properly access the memory element. Typically this is twice the schedule depth of the FREERUN domain. Because the FREERUN domain is always evaluating its evaluation list, bounding access to the memory elements in this fashion ensures proper operation of memory operations in both A and B domains.

Figure 13:
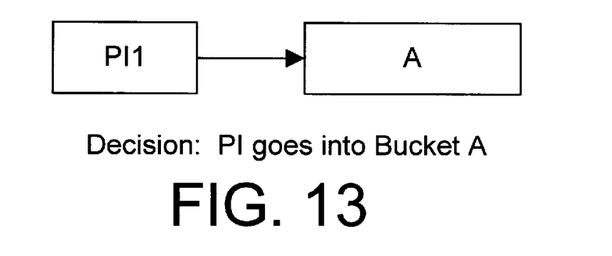
Figure 14:
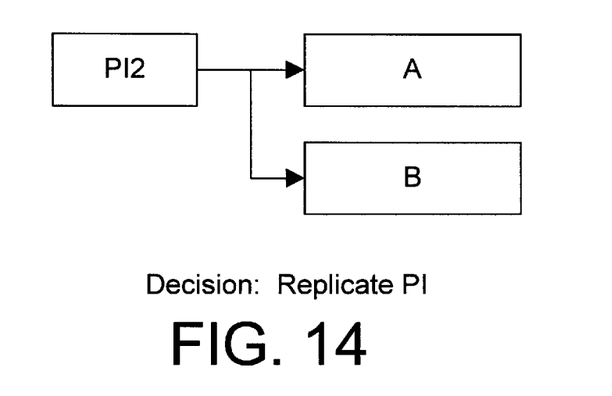
Figure 15:
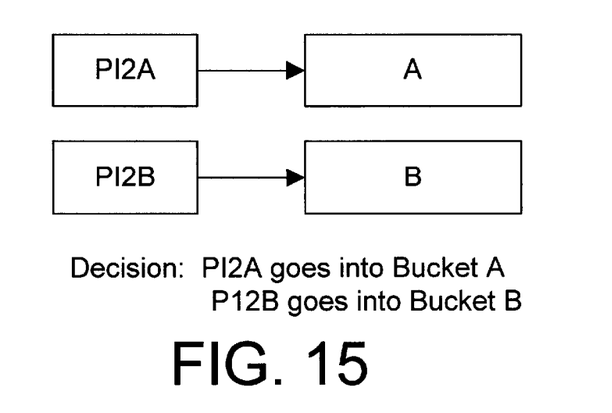

Now we address the issue of how primary inputs in the netlist are handled. Referring to FIG. 13, if a primary input PI1 feeds only one domain A, it is placed into the A bucket. Referring to FIG. 14, if a primary input PI2 feeds two different clock domains A and B, the primary input is replicated so that only one primary input feeds each domain. This replication is shown in FIG. 15, which reduces the problem of FIG. 14 to two cases that can be solved according to the criteria discussed with respect to FIG. 13 above. Thus, primary input PI2A is placed in the A bucket and primary input PI2B is placed in the B bucket.

Figure 16:
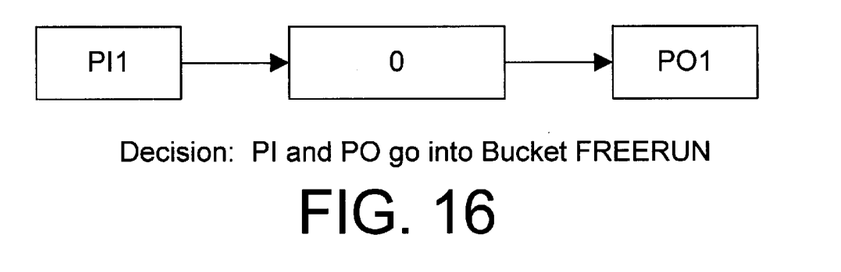
Figure 17:
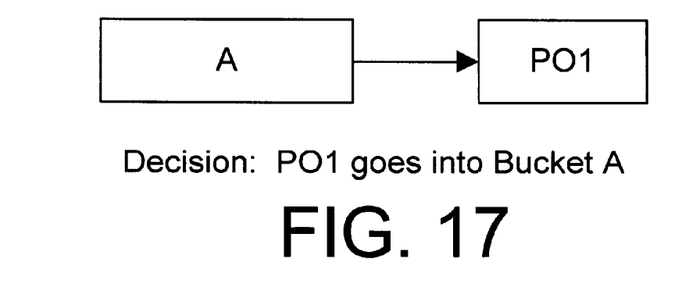

FIG. 16 illustrates the scenario of a primary input driving an uncolored block which directly drives a primary output. This scenario occurs when an input is passed to an output on the integrated circuit without passing through any logic that is clocked by a primary input clock. In this case, both the primary input PI1 and the primary output PO1 are placed in the FREERUN bucket. External devices utilizing this circuit must respect similar timing constraints to the FREERUN bucket as functional blocks with memory described with respect to FIG. 10.

If a single clock drives a primary output, the primary output is placed into the bucket corresponding to the single clock. Thus, in FIG. 17, because primary output PO1 is fed only by clock A, PO1 is placed in the A bucket. If two clocks drive a block that in turn drives a primary output, as in FIG. 18, both the block and the primary output are placed in the FREERUN bucket. Placing both block 18 and PO2 into the FREERUN bucket assures that the function of block 18 will always be applied to PO2.

In the preferred embodiment, the partition criteria referred to in step 430 of FIG. 4 includes the various criteria discussed above with respect to FIGS. 6–18. However, many other partition criteria could be used within the scope of the present invention. Any suitable method and criteria for partitioning a netlist into n+1 clock domains are expressly within the scope of the present invention.

Figure 19:
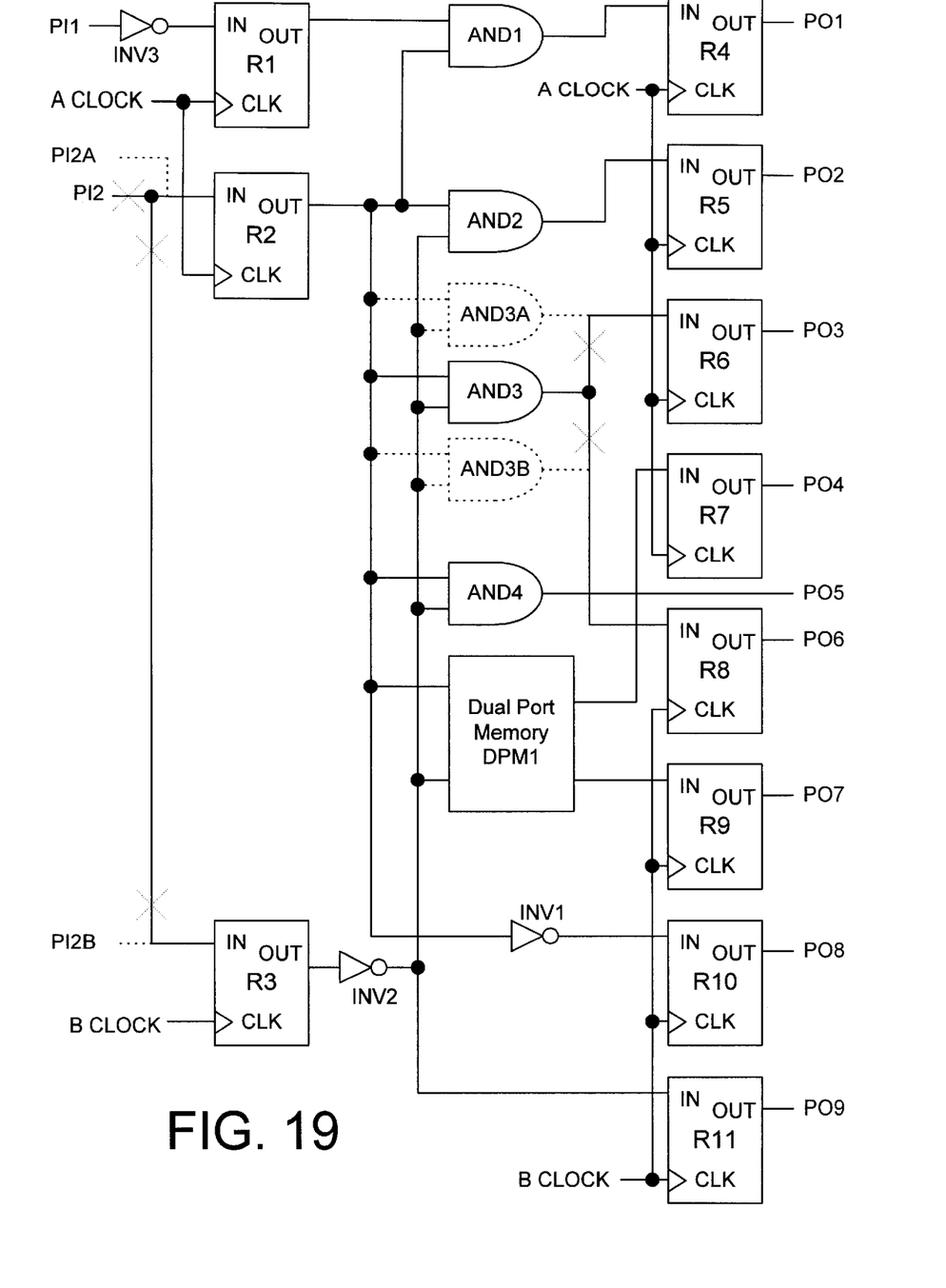
FIG. 19 is a block diagram of a sample circuit for partitioning.

Referring to FIG. 19, a very simple circuit is shown to illustrate the application of the method 400 of FIG. 4. We assume that the circuit of FIG. 19 is provided in netlist form. In step 410 of FIG. 4, the netlist of FIG. 19 is processed and colored with n colors. The circuit of FIG. 19 has only two primary input clocks, so n=2 for this circuit, and the blocks in FIG. 19 are colored either A or B, corresponding to the primary input clocks A and B. The details of step 410 are shown in FIG. 5.

First, the netlist is preprocessed in step 510. The netlist of FIG. 19 needs not such preprocessing because all the conditions of step 510 are already met. Next, step 520 specifies a list of primary input clocks, namely clocks A and B in FIG. 19. Step 530 then creates a two-bit field corresponding to each block in the netlist of FIG. 19. Step 540 then assigns the first bit of this field to the A clock and the second bit to the B clock. Note that "colors" may be assigned to these bit positions, with each color corresponding to only one primary input clock. However, for the sake of simplicity in illustrating the concepts of the preferred embodiments with respect to the circuit of FIG. 19, these bit positions are referred to as A and B rather than a color that in turn corresponds to clocks A and B.

In step 550, all the registers fed by primary input clocks are considered. In FIG. 19, the A clock feeds registers R1, R2, R4, R5, R6 and R7, while the B clock feeds registers R3, R8, R9, R10, and R11. Thus, step 550 sets the A bit of the color field corresponding to registers R1, R2, R4, R5, R6 and R7, and sets the B bit of the color field corresponding to registers R3, R8, R9, R10, and R11. In step 560, the output from each register is examined, and the color field for each block fed by each register output is logically ORed with the color field of the register that feeds it. Thus, register R1 feeds gate AND1, so the color field for AND1, which currently has no bits set, is logically ORed with the color field of R1, which has its A bit set. This results in the A bit being set in AND1.

Register R2 feeds blocks AND2, AND3 AND4, Dual Port Memory DPM1, and inverter INV1, so the color fields of each of these blocks, which have no bits set, is logically ORed with the color field of register R2, resulting in step 560 setting the A bit in each of these blocks. Register R3 feeds inverter INV2, which in turn feeds blocks AND2, AND3, AND4, and Dual Port Memory DPM1. The color fields for each of these blocks is logically ORed with the color field of register R3 in step 560, resulting in both A and B bits being set in blocks AND2, AND3, AND4, and Dual Port Memory DPM1, and only the B bit being set in block INV2.

At this point, most of the registers and blocks have been colored in the netlist of FIG. 19, and the primary inputs are considered next. Step 570 of FIG. 5 traces each primary input forward until a register is encountered, and then logically ORs the color field of all blocks in the path between the register and the primary input with the color field of the register. The primary input PI1 of FIG. 19 feeds R1 through inverter INV3, so the color field of inverter INV3, which has no bits set, is logically ORed with the color field of the R1 register, which has its A bit set, thereby setting the A bit in the color field of inverter INV3. The primary input PI2 feeds both R2 and R3 directly, without any components in between, so there are no components to color. The primary input clocks A and B have no components between them and the registers they are connected to as due to condition 1) of step 510 in FIG. 5, so there are no components between primary input clocks and registers to color. At this point step 410 is complete, and all blocks in FIG. 19 have been colored. With all blocks colored, the netlist is ready for partitioning.

Figure 20:
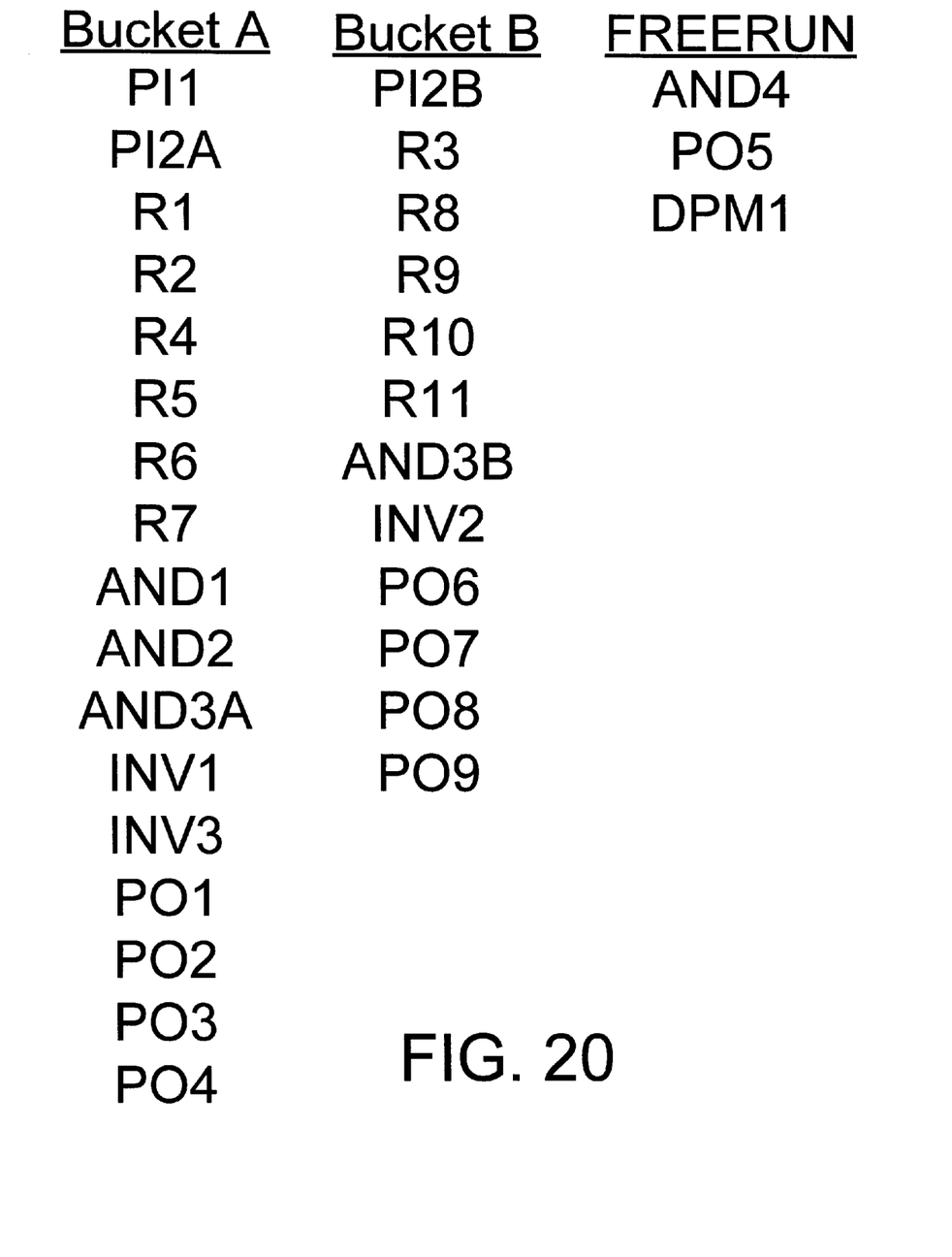
FIG. 20 is a diagram showing the partitioning of the two clock domain circuit of FIG. 19 into three clock domains in accordance with the preferred embodiments.

We assume that step 420 of FIG. 4 is performed, which for the example of FIG. 19 creates an A bucket, a B bucket, and a FREERUN bucket. Next, step 430 partitions the netlist of the circuit of FIG. 19 according to the partition criteria discussed above with respect to FIGS. 6–18, and places these blocks into these buckets, as shown in FIG. 20. We start first by analyzing the primary inputs PI1 and PI2. Primary input PI1 feeds only domain A, and thus has a configuration corresponding to FIG. 13, so PI1 is placed in the A bucket. Primary input PI2 has a configuration corresponding to FIG. 14, so primary input PI2 is replicated into two different primary inputs PI2A and PI2B, shown in FIG. 19 in phantom, with PI2A feeding register R2, PI2B feeding register R3, the original input PI2 being deleted, and the signal line cut as shown by the phantom lines. Each of these new primary inputs now correspond to the configuration of FIG. 13, and the primary input PI2A is put in the A bucket while the primary input PI2B is placed in the B bucket.

Each register in FIG. 19, by definition of the preprocessing in step 510 of FIG. 5, is fed by only a single primary input clock. Register R1 is fed by domain A and feeds only AND 1, which is only fed by domain A, so register R1 corresponds to the configuration in FIG. 6, and R1 is placed in the A bucket. R2 is fed by clock A, but feeds blocks AND1, AND2, AND3, AND4, DPM1, and INV1, so register R2 corresponds to the configuration in FIG. 9, and register R2 is placed in the A bucket.

Register R3 is fed by domain B and feeds through inverter INV2 register R11 and blocks AND2, AND3, AND4 and DPM1 that are also fed by domain A. Register R3 thus corresponds to the configuration of FIG. 6 with the exception that it has domain B as input and output rather than domain A, so register R3 is placed in the B bucket.

Step 550 of FIG. 5 sets the color bit of each register to the color corresponding to its primary input clock. Coloring step 410 assures that only this one bit will be set in the color field of each register. Registers are always put in the bucket corresponding to the primary input clock that feeds them. Registers R4, R5, R6 and R7 are all fed by primary input clock A, and each feed primary outputs. Each of these registers are thus placed in the A bucket. In similar fashion, registers R8, R9, R10 and R11 are all placed in the B bucket.

The AND1 gate has a configuration corresponding to FIG. 6, being fed by only the A clock and feeding only the A clock, so block AND1 is placed in the A bucket. Block AND2 has a configuration corresponding to FIG. 8, so AND2 is placed in the A bucket. AND3 has a configuration corresponding to FIG. 10, being fed by both A and B clocks and feeding both A and B clocks. AND3 is combinatorial, having no memory elements. As a result, AND3 is replicated into AND3A and AND3B, shown in phantom, the original AND3 is deleted, and the output of AND3 is cut as shown by the phantom lines so that AND3A drives register R6 and AND3B drives register R8. Note that the newly replicated blocks AND3A and AND3B both inherit the color field from the original block AND3 because the inputs are replicated, too. AND3A has a configuration corresponding to FIG. 1, and is therefore placed in the A bucket. AND3B has a configuration corresponding to FIG. 12, and is therefore placed in the B bucket.

Figure 18:
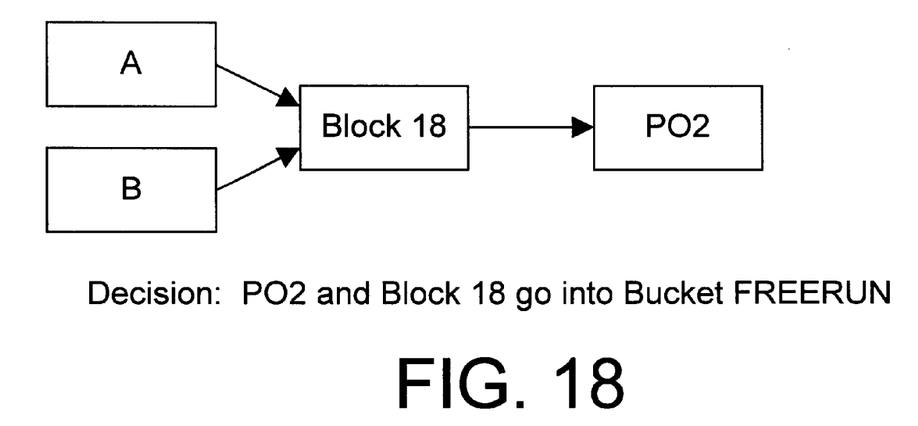

Block AND4 has a configuration corresponding to FIG. 18, with AND4 being fed by both clocks A and B, and providing a primary output. As a result, block AND4 and the primary output PO5 are placed in the FREERUN bucket. In addition, dual port memory DPM1 has a configuration corresponding to FIG. 10, and has memory, so block DPM1 is placed in the FREERUN bucket.

Inverter INV1 has a configuration corresponding to FIG. 7, and can thus be placed in either bucket A or bucket B, but is preferably placed in the bucket that minimizes I/O between buckets. Block INV1 only has one input and one output, so the selection between buckets A and B is arbitrary, and INV1 is arbitrarily placed in bucket A. Inverter INV2 has a configuration corresponding to FIG. 9, except that INV2 has clock B as its only input, so INV2 is placed in the B bucket. Inverter INV3 has a configuration corresponding to FIG. 6, so INV3 is placed in the A bucket.

The only remaining blocks in FIG. 19 to place in the buckets are the primary outputs PO1–PO4 and PO6–PO9. Primary outputs PO1–PO4 are each fed by a block from domain A, so each of these primary outputs has a configuration corresponding to FIG. 17, and each of PO1–PO4 are placed in the A bucket. In similar fashion, PO6–PO9 are each placed in the B bucket. Once method 400 of FIG. 4 is complete, the blocks are stored in the three different buckets, A, B and FREERUN, as shown in FIG. 20. Each of these buckets corresponds to a different clock domain in the circuit. Bucket A contains blocks that are in domain A, bucket B contains blocks that are in domain B, and the FREERUN bucket contains blocks that must be free-running during the emulation of domains A and B to assure accurate emulation.

The preferred embodiments described herein allow a netlist to be partitioned into a number of buckets equal to the number of primary input clocks plus one. There is one bucket that corresponds to each primary input clock (i.e., clock domain), and an additional FREERUN bucket for blocks that must be kept running during emulation.

While the invention has been particularly shown and described with reference to preferred embodiments thereof, it will be understood by those skilled in the art that various changes in form and details may be made therein without departing from the spirit and scope of the invention. For example, while many different criteria are disclosed herein for partitioning a netlist into different buckets, one skilled in the art will recognize that many other partition criteria not disclosed herein could be used within the scope of the present invention. The present invention expressly includes any and all partition criteria that may be used to partition a netlist into n+1 buckets, with n buckets corresponding to the number of primary input clocks and an additional bucket for blocks that must be free running during the emulation. In addition, while the present invention is disclosed in the context of an enhanced emulator, the concepts of the present invention also apply to a simulation environment and to a hardware-assisted simulation environment. In addition, while the present invention is described herein with respect to a netlist that has two clock domains for the purpose of simplifying the illustration of the concepts of the invention, the present invention extends to the partitioning of netlists into any number of clock domains.

I claim:

1. A method for partitioning a netlist, the netlist including a plurality of functional blocks in a circuit design, comprising:

partitioning the netlist into a number of clock domains greater than a number of primary input clocks in the netlist; and processing and coloring the netlist with a number of colors equal to the number of primary input clocks in the netlist.

2. The method of claim 1 wherein the step of processing and coloring the netlist comprises the steps of:

(A) preprocessing the netlist so that:
(A1) each register in the netlist is fed only by a clock that is a primary input;
(A2) each register in the netlist is fed by only one clock; and
(A3) each primary output in the netlist is fed by only one functional block;

(B) creating a color field for each of the plurality of functional blocks with a number of bits equal to the number of primary input clocks in the netlist;

(C) assigning each bit position in the color field to a corresponding primary input clock;

(D) for each primary input clock in the netlist:
(D1) setting a bit in the color field corresponding to the primary input clock in all registers fed by the primary input clock;

(E) for each register in the netlist:
  (E1) identifying functional blocks, if any, that feed the register forward;
  (E2) logically ORing the color field of the functional blocks with the color field of the register;
(F) for each primary input in the netlist:
  (F1) identify functional blocks that lie between the primary input and a register;
  (F2) for each register, logically ORing the color field of the functional blocks that lie between the primary input and the register with the color field of the register;
  (F3) identify functional blocks that are uncolored and that lie between the primary input and a primary output;
  (F4) for each uncolored functional block, logically ORing the color field of a first-encountered colored predecessor functional block with the color field of the uncolored functional block.

3. The method of claim 1 wherein the number of clock domains equals the number of primary input clocks plus one.

4. The method of claim 1 wherein the clock domains include one clock domain corresponding to each of the plurality of primary input clocks and one clock domain corresponding to a freerun domain.

5. A method for partitioning a netlist, the netlist including a plurality of functional blocks in a circuit design, comprising:
  partitioning the netlist into a number of clock domains greater than a number of primary input clocks in the netlist, wherein the step of partitioning the netlist into a number of clock domains comprises:
  providing a number of buckets greater than the number of primary input clocks; and
  placing each of the plurality of functional blocks in the netlist into one of the buckets according to at least one partition criterion.

6. The method of claim 5 wherein the at least one partition criterion identifies characteristics of each functional block and assigns each functional block to a clock domain according to the characteristics of the functional block.

7. The method of claim 5 wherein the at least one partition criterion identifies the primary input clocks, if any, that feed a selected functional block and the functional blocks, if any, fed by the selected functional block and fed by the primary input clocks.

8. The method of claim 5 wherein the at least one partition criterion specifies that a functional block that is fed by logic that is clocked only by one primary input clock and that feeds logic that is clocked only by the same one primary input clock is placed in the bucket corresponding to the one primary input clock.

9. The method of claim 5 wherein the at least one partition criterion specifies that a functional block that is fed by logic that is clocked only by a first primary input clock and that feeds logic that is clocked only by a second primary input clock is placed in the bucket corresponding to the primary input clock that minimizes input/output (I/O) connections between buckets.

10. The method of claim 5 wherein the at least one partition criterion specifies that a functional block that is fed by logic that is clocked by multiple primary input clocks and that feeds logic that is clocked only by one of the multiple primary input clocks is placed in the bucket corresponding to the one of the multiple primary input clocks.

11. The method of claim 5 wherein the at least one partition criterion specifies that a functional block that is fed by logic that is clocked only by a first primary input clock and that feeds logic that is clocked by multiple primary input clocks including the first primary input clock is placed in the bucket corresponding to the first primary input clock.

12. The method of claim 5 wherein the at least one partition criterion specifies that a functional block that is combinatorial and fed by logic that is clocked by multiple primary input clocks and that feeds logic that is clocked by multiple primary input clocks is replicated so that each replica feeds logic that is clocked only by a single primary input clock, and that each replica is placed in an appropriate bucket based on the primary input clocks that feed the replica and the functional blocks, if any, fed by the replica and fed by the primary input clocks.

13. The method of claim 5 wherein the at least one partition criterion specifies that a functional block that has memory and that is fed by logic that is clocked by multiple primary input clocks and that feeds logic that is clocked by multiple primary input clocks is placed into a freerun bucket.

14. The method of claim 5 wherein the at least one partition criterion specifies that a primary input to the netlist that feeds logic that is clocked only by one primary input clock is placed in the bucket corresponding to the one primary input clock.

15. The method of claim 5 wherein the at least one partition criterion specifies that a primary input to the netlist that feeds logic that is clocked by multiple primary input clocks is replicated so that each replica feeds logic that is clocked by one primary input clock, with each replica being placed in the bucket corresponding to the primary input clock.

16. The method of claim 5 wherein the at least one partition criterion specifies that a primary output from the netlist that is fed by logic that is clocked only by a first primary input clock is placed in the bucket corresponding to the first primary input clock.

17. The method of claim 5 wherein the at least one partition criterion specifies that a primary output from the netlist that is fed by logic that is clocked by multiple primary input clocks is placed in a freerun bucket.

18. A method for partitioning a netlist into a plurality of clock domains, the netlist including a plurality of functional blocks in a circuit design, the method comprising the steps of:
  (1) processing and coloring the netlist with a number of colors equal to the number of primary input clocks in the netlist, including the steps of:
    (A) preprocessing the netlist so that:
      (A1) each register in the netlist is fed only by a clock that is a primary input;
      (A2) each register in the netlist is fed by only one clock; and
      (A3) each primary output in the netlist is fed by only one functional block;
    (B) creating a color field for each of the plurality of functional blocks with a number of bits equal to the number of primary input clocks;
    (C) assigning each bit position in the color field to a corresponding primary input clock;
    (D) for each primary input clock in the netlist:
      (D1) setting a bit in the color field corresponding to the primary input clock in all registers fed by the primary input clock;
    (E) for each register in the netlist:
      (E1) identifying functional blocks, if any, that feed the register forward;
      (E2) logically ORing the color field of the functional blocks with the color field of the register;

(F) for each primary input in the netlist:
  (F1) identify functional blocks that lie between the primary input and a register;
  (F2) for each register, logically ORing the color field of all functional blocks that lie between the primary input and the register with the color field of the register;
  (F2) identify functional blocks that are uncolored and that lie between the primary input and a primary output;
  (F3) for each uncolored functional block, logically ORing the color field of a first-encountered colored predecessor functional block with the color field of the uncolored functional block;
(2) partitioning the netlist into a number of clock domains equal to the number of primary input clocks plus one, wherein the clock domains include one clock domain corresponding to each of the plurality of primary input clocks and one clock domain corresponding to a freerun domain, wherein the step of partitioning the netlist into a number of clock domains comprises the steps of:
  providing a number of buckets corresponding to the number of clock domains; and
  placing each of the plurality of functional blocks in the netlist into one of the buckets according to at least one partition criterion;
  the at least one partition criterion specifying that a functional block that is fed by logic that is clocked only by one primary input clock and that feeds logic that is clocked only by the same one primary input clock is placed in the bucket corresponding to the one primary input clock;
  the at least one partition criterion specifying that a functional block that is fed by logic that is clocked only by a first primary input clock and that feeds logic that is clocked only by a second primary input clock is placed in the bucket corresponding to the primary input clock that minimizes input/output (I/O) connections between buckets;
  the at least one partition criterion specifying that a functional block that is fed by logic that is clocked by multiple primary input clocks and that feeds logic that is clocked only by one of the multiple primary input clocks is placed in the bucket corresponding to the one of the multiple primary input clocks;
  the at least one partition criterion specifying that a functional block that is fed by logic that is clocked only by one primary input clock and that feeds logic that is clocked by multiple primary input clocks including the one primary input clock is placed in the bucket corresponding to the one primary input clock;
  the at least one partition criterion specifying that a functional block that is combinatorial and fed by logic that is clocked by multiple primary input clocks and that feeds logic that is clocked by multiple primary input clocks is replicated so that each replica feeds logic that is clocked only by a single primary input clock, and that each replica is placed in an appropriate bucket based on the primary input clocks, if any, that feed the replica and the functional blocks, if any, fed by the replica and fed by the primary input clocks;
  the at least one partition criterion specifying that a functional block that has memory and that is fed by logic that is clocked by multiple primary input clocks and that feeds logic that is clocked by multiple primary input clocks is placed into a freerun bucket;
  the at least one partition criterion specifying that a primary input to the netlist that feeds logic that is clocked only by one primary input clock is placed in the bucket corresponding to the one primary input clock;
  the at least one partition criterion specifying that a primary input to the netlist that feeds logic that is clocked by multiple primary input clocks is replicated so that each replica feeds logic that is clocked by one primary input clock, with each replica being placed in the bucket corresponding to the primary input clock;
  the at least one partition criterion specifying that a primary output from the netlist that is fed by logic that is clocked only by one primary input clock is placed in the bucket corresponding to the one primary input clock;
  the at least one partition criterion specifying that a primary output from the netlist that is fed by logic that is clocked by multiple primary input clocks is placed in the freerun bucket.

* * * * *